(12) United States Patent
Schumacher et al.

(10) Patent No.: US 9,977,758 B1
(45) Date of Patent: May 22, 2018

(54) DEVICE PROFILING FOR TUNING OPENCL APPLICATIONS ON PROGRAMMABLE INTEGRATED CIRCUITS

(71) Applicant: Xilinx, Inc., San Jose, CA (US)

(72) Inventors: Paul R. Schumacher, Berthoud, CO (US); Kumar Deepak, San Jose, CA (US); Graham F. Schelle, Longmont, CO (US)

(73) Assignee: XILINX, INC., San Jose, CA (US)

( * ) Notice: Subject to any disclaimer, the term of this patent is extended or adjusted under 35 U.S.C. 154(b) by 207 days.

(21) Appl. No.: 14/887,080

(22) Filed: Oct. 19, 2015

(51) Int. Cl.
*G06F 13/42* (2006.01)
*G06F 9/445* (2018.01)

(52) U.S. Cl.
CPC ...... *G06F 13/4221* (2013.01); *G06F 9/44505* (2013.01); *G06F 2212/1016* (2013.01); *G06F 2212/1024* (2013.01)

(58) Field of Classification Search
CPC ............. G06F 9/44505; G06F 13/4221; G06F 2212/1016; G06F 2212/1024
See application file for complete search history.

(56) References Cited

U.S. PATENT DOCUMENTS

| | | | |
|---|---|---|---|
| 9,058,135 B1 | 6/2015 | Schumacher et al. | |
| 9,081,925 B1 * | 7/2015 | Schumacher | ....... G06F 17/5022 |
| 9,147,024 B1 * | 9/2015 | Kathail | ............... G06F 17/5045 |
| 2006/0235648 A1 * | 10/2006 | Zheltov | ............... G06F 11/3404 702/182 |
| 2013/0212365 A1 * | 8/2013 | Chen | .................... G06F 17/5054 713/1 |

OTHER PUBLICATIONS

Specification and drawings for U.S. Appl. No. 14/278,263, filed May 15, 2014, Schumacher et al.

* cited by examiner

*Primary Examiner* — Eric Oberly
(74) *Attorney, Agent, or Firm* — Kevin T. Cuenot

(57) ABSTRACT

A system may include a first region implemented in programmable circuitry of a programmable integrated circuit. The first region may include predefined interface circuitry configured to communicate with a host processor. The system may include a second region implemented in the programmable circuitry of the programmable integrated circuit. The second region may include a first hardware accelerated kernel of an OpenCL application. The system may include a first monitor circuit implemented within the first region or the second region. The first hardware accelerated kernel and the first monitor circuit may be coupled to the interface circuitry of the first region. The first monitor circuit may be operable responsive to control signals received from the host processor of a platform through the interface circuitry to store operation data for the first region or the first hardware accelerated kernel.

20 Claims, 6 Drawing Sheets

US 9,977,758 B1

DEVICE PROFILING FOR TUNING OPENCL APPLICATIONS ON PROGRAMMABLE INTEGRATED CIRCUITS

TECHNICAL FIELD

This disclosure relates to integrated circuits and, more particularly, to device profiling for tuning an OpenCL application that uses a programmable integrated circuit.

BACKGROUND

Open Computing Language (OpenCL) is a framework for writing programs that execute on a platform. A platform refers to a computing system that includes a host processor and a collection of one or more devices. For example, a platform may include various combinations of one or more central processing units (CPUs), graphics processing units (GPUs), digital signal processors (DSPs), programmable integrated circuits (ICs), and/or the like. One of the processors, e.g., the CPU, is typically designated as the host processor. Portions of the OpenCL application execute on the host processor and other portions of the OpenCL application referred to as kernels may be implemented by different ones of the devices.

While the majority of the devices noted above execute program code, a programmable IC may be used to hardware accelerate program code. Hardware acceleration refers to implementing the functionality of a portion of program code in hardware or circuitry. A hardware accelerator refers to a circuit implementation of computer readable program instructions (e.g., program code). A hardware accelerator is functionally equivalent to the program code being hardware accelerated. Thus, rather than execute a kernel of an OpenCL application on a processor to perform a given task, the kernel may be implemented as a hardware accelerator that performs the task.

While OpenCL provides many advantages, developers may be hampered by the lack of observability in the platform at run-time. This may be particularly true in cases where programmable ICs are used to hardware accelerate one or more kernels of the OpenCL application.

SUMMARY

A system may include a first region implemented in programmable circuitry of a programmable IC, wherein the first region includes predefined interface circuitry configured to communicate with a host processor. The system may also include a second region implemented in the programmable circuitry of the programmable IC. The second region may include a first hardware accelerated kernel of an OpenCL application. The system may include a first monitor circuit implemented within the first region or the second region. The first hardware accelerated kernel and the first monitor circuit may be coupled to the interface circuitry of the first region. The first monitor circuit may be operable responsive to control signals received from the host processor of a platform through the interface circuitry to store operation data for the first region or the first hardware accelerated kernel.

A method may include, using a processor, generating an RTL description of a kernel of an OpenCL application from an HLL description of the kernel, using the processor, designating the RTL description of the kernel for implementation within an OpenCL region of a programmable IC, and, using the processor, automatically including a monitor core coupled to the RTL description of the kernel within the OpenCL region. The monitor core may be configured to detect operations of a hardware accelerated version of the kernel. The method may include, using the processor, implementing the RTL description of the kernel and the monitor core for the OpenCL region.

A non-transitory computer-readable storage medium may have instructions stored thereon which, when executed by a processor, perform a method. The method may include generating an RTL description of a kernel of an OpenCL application from an HLL description of the kernel, designating the RTL description of the kernel for implementation within an OpenCL region of a programmable IC, and automatically including a monitor core coupled to the RTL description of the kernel within the OpenCL region. The monitor core may be configured to detect operations of a hardware accelerated version of the kernel. The method further may include implementing the RTL description of the kernel and the monitor core for the OpenCL region.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
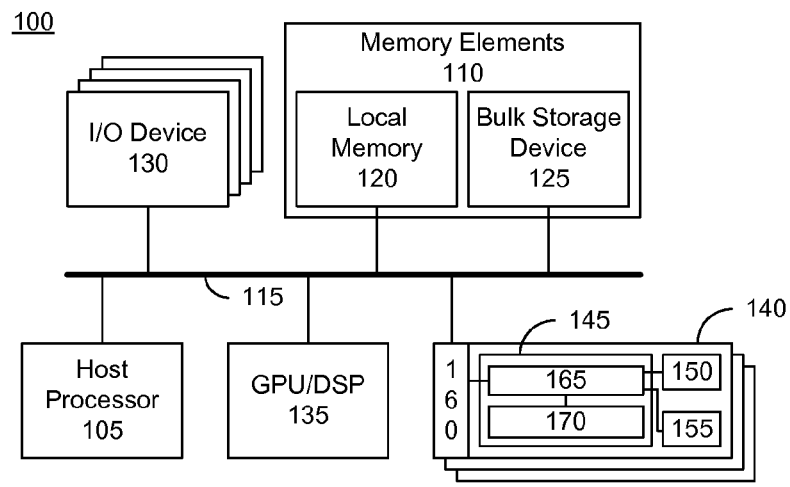
FIG. 1 is a block diagram illustrating an exemplary platform.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to device profiling for tuning an OpenCL application that uses a programmable IC. In accordance with the inventive arrangements described within this disclosure, one or more monitor circuits may be incorporated into a programmable IC used to implement a platform for an OpenCL application and/or a device of a platform. The programmable circuitry of a programmable IC may be used to implement one or more kernels of the OpenCL application. Monitor circuits may be incorporated into the programmable circuitry. In other cases, monitor circuits may be incorporated into the programmable IC as hardwired circuits.

The programmable IC may include an OpenCL region and a static region. The OpenCL region may be used to implement one or more kernels of the OpenCL application. In one aspect, the OpenCL region may be a dynamically reconfigurable region. As a dynamically reconfigurable region, the OpenCL region may change to implement different physical circuitry representing different kernels or groups of kernels. In another aspect, while the OpenCL region may implement one or more kernels, the OpenCL region may not be dynamically reconfigurable. In either case, the OpenCL region may include one or more monitor circuits. The monitor circuits of the OpenCL region may be incorporated to monitor operation of hardware accelerated kernel(s) implemented therein at compile time of the kernel(s).

The static region is referred as "static" since the circuitry included therein is predefined. The circuitry of the static region may remain unchanged despite the circuitry of the OpenCL region being unknown until compile time of the hardware accelerated kernels. Further, in the case where the OpenCL region is a dynamically reconfigurable region, the circuitry of the static region may remain unchanged as circuitry in the OpenCL changes dynamically during operation of the programmable IC. The static region may provide interface circuitry that allows a host to communicate with any hardware accelerated kernels implemented within the OpenCL region. The static region may also include one or more monitor circuits. The monitor circuits may be implemented as a permanent or fixed part of the interface circuitry of the static region.

Monitor circuit(s) implemented within the OpenCL region may be configured to detect various operations of the hardware accelerated kernel(s). The monitor circuit(s) may store operation data and/or allow the host to read or otherwise access accumulated operation data. An OpenCL application developer may evaluate the collected operation data to tune or otherwise adjust the OpenCL application to achieve improved performance.

The inventive arrangements described herein may be implemented as a method or process performed by a data processing system. In another aspect, the inventive arrangements may be implemented as a data processing system having a processor. In still another aspect, the inventive arrangements may be implemented as a non-transitory computer-readable storage medium storing program code that, when executed, causes a processor and/or a system to perform and/or initiate a method or process.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary platform 100. As defined herein, a "platform" refers to a data processing system that is configured to execute a heterogeneous application intended to be executed and/or implemented using one or more different processors and/or devices of the data processing system. As noted, an example of a heterogeneous application is an OpenCL application. In general, a platform includes a host (e.g., a central processing unit or "CPU") configured to execute host program code of the OpenCL application and one or more devices configured to implement kernels of the OpenCL application. At least one device of the platform is configured to hardware accelerate one or more kernels of the OpenCL application.

A programmable IC is an example of a device for hardware accelerating a kernel. An example of a programmable IC is a field programmable gate array (FPGA). Optionally, one or more other devices of the platform may execute kernels. Devices that execute kernels may use a different instruction set than the host processor. Exemplary devices that may execute kernels may include, but are not limited to, a graphics processing unit (GPU); a CPU, a digital signal processor (DSP), or the like.

As pictured, platform 100 may include a host processor (host) 105. Host 105 may be implemented as a CPU. Host 105 may be coupled to memory elements 110 through a system bus 115 or other suitable circuitry. Platform 100 may store program code, at least in part, within memory elements 110. Memory elements 110 may include one or more physical memory devices such as, for example, a local memory 120 and one or more bulk storage devices 125. Local memory 120 refers to random access memory (RAM) or other non-persistent memory device(s) generally used during actual execution of the program code. Bulk storage device 125 may be implemented as a hard disk drive (HDD), solid state drive (SSD), or other persistent data storage device. Platform 100 may also include one or more cache memories (not shown).

Platform 100 may be coupled to one or more input/output (I/O) devices 130. Exemplary I/O devices may include, but are not limited to, a keyboard, a display device, a pointing device, and/or one or more network adapters. For ease of illustration, an operating system and applications are not illustrated. It should be appreciated that platform 100 may execute an operating system in combination with an OpenCL application.

Platform 100 may optionally include one or more additional devices configured to execute kernels. The additional devices may be one or more of GPUs and/or DSPs illustrated as GPU/DSP 135. Platform 100, as noted, further may include one or more devices 140. Devices 140 may be used to hardware accelerate one or more kernels. Each of devices 140 may include a programmable IC 145 that may communicate with other elements of platform 100 through system bus 115 or other circuitry.

An application such as an OpenCL application configured for hardware acceleration may be stored in memory elements 110 and executed by platform 100. When compiled, the OpenCL application may include executable program code that is executed by host 105. The OpenCL application may also include executable program code that may be referred to as a kernel. The OpenCL application may include one or more kernels that may be offloaded from host 105 to one or more of the other processors, e.g., GPU/DSP 135, for execution, thereby increasing overall execution speed and efficiency.

The OpenCL application further may include one or more kernels that may be hardware accelerated and implemented as circuitry within programmable IC 145 of device 140. Kernels implemented as circuitry are said to be "hardware accelerated" and may be referred to as "hardware accelerators," "hardware accelerated kernels," or variations thereof. For example, one or more configuration bitstreams specifying circuitry including a hardware accelerated kernel may be stored in memory elements 110 as one or more binary files that may be loaded into programmable IC 145 of device 140 to implement the kernel in circuitry. The circuitry of programmable IC 145 may implement a kernel that operates faster and with greater efficiency than had the kernel been executed as program code by GPU/DSP 135.

For purposes of description and ease of illustration, OpenCL terminology is used throughout this application. It should be appreciated, however, that any of a variety of different applications written in a high level programming language (HLL) may be hardware accelerated. In this regard, within this disclosure, the term "host program code" may refer to program code that is not hardware accelerated. For example, "host program code" may refer to program code intended to be executed by a CPU or a host such as host 105. The term "kernel" or "kernel program code" may refer to program code not intended to execute on host 105 and that may be hardware accelerated regardless of whether the program code is part of an OpenCL application.

In the example of FIG. 1, device 140 may be implemented as a circuit board with a plurality of components coupled thereto. Device 140 may include programmable IC 145, RAM 150, flash memory 155, and one or more interfaces 160. RAM 150 may be implemented as one or more RAM circuit modules coupled to programmable IC 145. Flash memory 155 may be implemented as one or more flash memory circuit modules coupled to programmable IC 145. Interface 160 may be implemented as circuitry and/or a physical connector that is coupled to programmable IC 145 through circuitry on the circuit board.

In one aspect, interfaces 160 may be implemented as one or more 10 gigabit Ethernet interfaces that allow device 140 to couple to one or more other systems such as host 105. Interfaces 160 may also include other interfaces including, but not limited to, Serial Advanced Technology Attachment (SATA) interfaces that allow device 140 to couple to one or more other systems, a Joint Test Action Group (JTAG) interface, or the like.

As noted, programmable IC 145 may be implemented as an FPGA. Programmable IC 145 may include programmable circuitry in which regions 165 and 170 may be implemented. Region 165 may be a static region. Region 170 may be an OpenCL region. Region 170 is the portion of programmable circuitry of programmable IC 145 in which hardware accelerators, e.g., hardware accelerated kernels, are implemented as circuitry.

Region 170 may or may not be implemented as a dynamically reconfigurable region. A dynamically reconfigurable region is an area of programmable circuitry of a programmable IC where circuitry may be modified or changed by downloading a partial configuration bitstream. The partial configuration bitstream may implement new and/or different circuitry within the dynamically reconfigurable region that what was previously implemented while surrounding circuitry also implemented within the programmable circuitry continues to operate uninterrupted. When implemented as a dynamically reconfigurable region, the circuitry within region 170 may be changed while circuitry within other regions that are not dynamically reconfigurable, e.g., region 165, continue to operate without interruption. For example, region 165 may remain in communication with host 105 while region 170 is reconfigured.

Region 165 may include static circuitry that is predefined and that provides an interface for hardware accelerated kernels within region 170. For example, the circuitry of region 165 may be developed by a circuit board vendor or other third party and be provided to an end user as a configuration bitstream. In this regard, the circuitry of region 165, while implemented in programmable circuitry, may not be changed by the end user. Region 165 provides interface circuitry that allows hardware accelerated kernels to communicate with host 105, RAM 150, Flash memory 155, other components that may be implemented on the circuit board of device 140, or the like.

In one aspect, both region 165 and region 170 may be implemented by loading a configuration bitstream into programmable IC 145. The configuration bitstream may be a full configuration bitstream specifying circuitry for both of regions 165 and 170. In another aspect, the configuration bitstream specifying the static circuitry in region 165 may be a partial configuration bitstream. In that case, the configuration bitstream specifying hardware accelerated kernels for region 170 may also be a partial configuration bitstream. When loading a partial configuration bitstream for region 170, e.g., in the case where region 170 is dynamically reconfigurable, the circuitry of region 165 may remain unchanged and operational while circuitry within region 170 may be modified or entirely changed.

It should be appreciated that circuitry within region 170 is derived from user designs, i.e., kernel program code of an OpenCL application that is to be hardware accelerated. Circuitry within region 170 may change during operation of programmable IC 145 to implement one or more different kernels as may be required. Circuitry within region 165 may remain unchanged regardless of the kernels that are hardware accelerated and implemented in region 170. The circuitry within region 165 does not change with different user kernel designs and continues to provide an interface for the various kernels that may be hardware accelerated within region 170.

Figure 2:
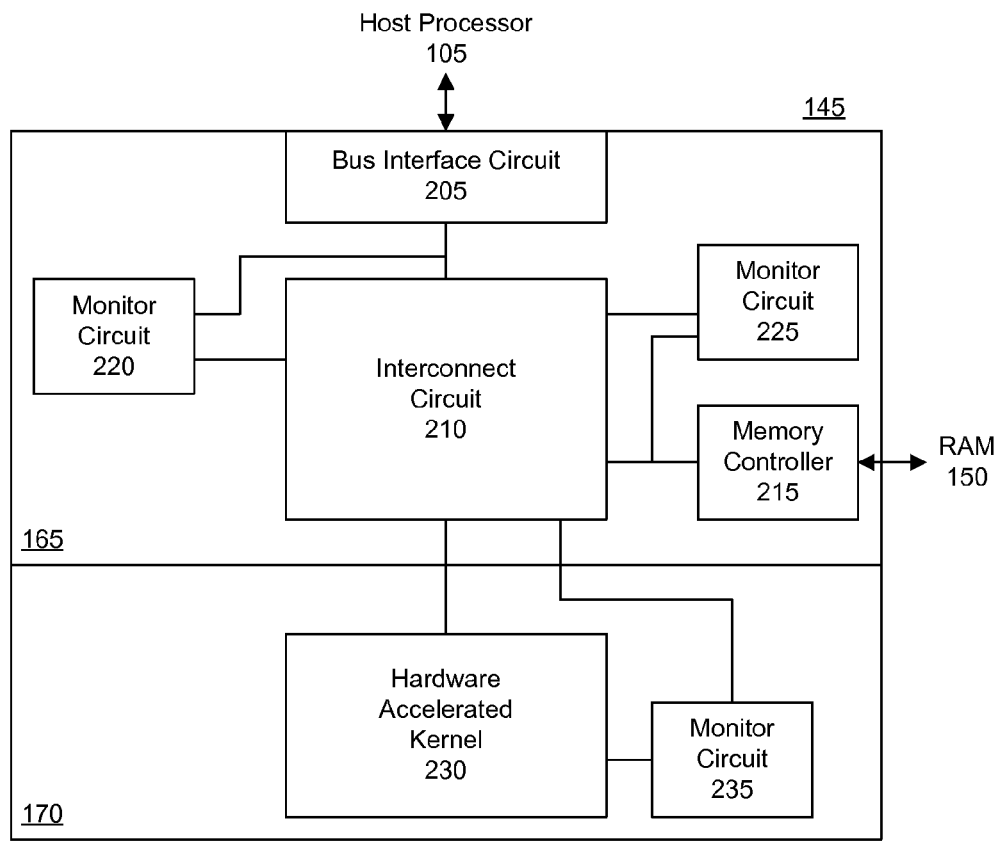
FIG. 2 is a block diagram illustrating an exemplary implementation of a programmable integrated circuit (IC).

FIG. 2 is a block diagram illustrating an exemplary implementation of programmable IC 145 of FIG. 1. FIG. 2 illustrates a more detailed example of circuitry implemented within regions 165 and 170 of programmable IC 145.

The interface circuitry of region 165 may include a bus interface circuit 205, an interconnect circuit 210, and a memory controller 215. Region 165 may also include a monitor circuit 220 and a monitor circuit 225. Bus interface circuit 205 may be implemented as a PCIe interface circuit. In one aspect, bus interface circuit 205 may also include direct memory access (DMA) support. Bus interface circuit 205 sends communications from programmable IC 145 to host 105 and receives communications from host 105 intended for programmable IC 145.

Bus interface circuit 205 and memory controller 215 are both coupled to interconnect circuit 210. Interconnect circuit 210 may include a plurality of ports to which various circuit blocks may be connected. In general, interconnect circuit 210 may route communications among the various circuit blocks coupled thereto. In one arrangement, interconnect circuit 210 may be implemented as an AXI Interconnect. As such, interconnect circuit 210 may connect one or more memory-mapped master devices to one or more memory-mapped slave devices.

Monitor circuit 220 may be coupled to the signals exchanged between bus interface circuit 205 and interconnect 210. Accordingly, monitor circuit 220 may be configured to monitor communications between bus interface circuit 205 and interconnect circuit 210. Monitor circuit 220 may also be coupled to a port of interconnect circuit 210. As such, host processor 105 may control operation of monitor circuit 220 during run-time by sending control signals through bus interface circuit 205 and interconnect circuit 210 to monitor circuit 220.

Monitor circuit 225 may be coupled to the signals exchanged between memory controller 215 and interconnect circuit 210. Accordingly, monitor circuit 225 may be configured to monitor communications received by memory controller 215 and sent by memory controller 215, e.g., read and/or write operations of memory controller 215. Monitor circuit 225 may also be coupled to a port of interconnect circuit 210. As such, host 105 may control operation of monitor circuit 225 during run-time by sending control signals through bus interface circuit 205 and interconnect circuit 210 to monitor circuit 225.

Region 170 may include one or more hardware accelerated kernels (kernel) 230 and a monitor circuit 235. Kernel 230 is coupled to interconnect circuit 210. As such, kernel 230 may communicate with host 105 via bus interface circuit 205 and may access (e.g., read and/or write) RAM 150 via memory controller 215. Monitor circuit 235 may be coupled to kernel 230. Accordingly, monitor circuit 235 may be configured to monitor operations performed by kernel 230. Monitor circuit 235 may also be coupled to a port of interconnect circuit 210. As such, host 105 may control operation of monitor circuit 235 during run-time by sending control signals through bus interface circuit 205 and interconnect circuit 210 to monitor circuit 235.

In one arrangement, kernel 230 may be implemented as, or include, a plurality of compute units. The compute units may operate in parallel. Each compute unit may be connected to interconnect circuit 210. Monitor circuit 235 may be configured to monitor kernel 230 on a per compute unit basis. In one example, monitor circuit 235 may monitor operations of up to 8 compute units of a kernel. It should be appreciated that monitor circuit 235 may monitor fewer or more than 8 compute units. In this regard, monitor circuit 235 may determine which compute units of kernel 230 are active and which are not.

As noted, the circuit blocks of region 165 may be implemented as static circuitry in that the circuitry in region 165 is not dependent upon the kernels and/or monitor circuits implemented in region 170. For example, bus interface circuit 205, interconnect circuit 210, memory controller 215, monitor circuits 220 and 225, and the connectivity among the circuit blocks may be predetermined. A device vendor, for example, may design region 165 and provide the circuit design for region 165 with the device to a user. As such, monitor circuits 220 and 225 may be implemented as part of the static circuitry infrastructure. It should be appreciated, however, that monitor circuits 220 and/or 225 may be fully controlled, e.g., turned on, turned off, read, and the like, by host 105 at run-time of the OpenCL application.

Because the circuitry in region 170 is dependent upon the particular kernel and/or kernels that are implemented therein, circuitry in region 170 is not predefined. In one arrangement, monitor circuit 235 may be added or included to a circuit design that implements kernel 230 at the time kernel 230 is compiled or otherwise processed for implementation within programmable IC 145.

In one example, monitor circuits 220, 225, and/or 235 may be implemented as one or more LogiCORE IP AXI Performance Monitors (AXI Performance Monitor) available from Xilinx, Inc. of San Jose, Calif. The AXI Performance Monitor enables AXI system performance measurement for multiple slots, e.g., AXI4, AXI3, AXI4-Stream, and AXI4-Lite. The AXI Performance Monitor may capture real-time performance metrics for throughput and latency for connected AXI interfaces. The AXI Performance Monitor can log AXI transactions, external system events, and perform real-time profiling for software applications.

In general, monitor circuits 220, 225, and 235 may collect and/or store operation data for the particular circuit blocks being monitored. Operation data may include, but is not limited to, timestamped start and/or timestamped stop events for data transfers, aggregate counts of bytes, data transfer counts, latency, minimum and/or maximum latency, stall cycle measurements, busy and/or idle time, and the like. It should be appreciated that monitor circuit 235 may collect and/or store the foregoing information from within region 170. In this regard, monitor circuit 235 may collect and/or store operation data, as described, relating to data transfers between kernel 230 and another kernel (not shown), to and/or from pipes, and/or from other local memory within region 170.

A pipe generally refers to a communication channel that has two endpoints including a write endpoint into which data items are inserted and a read endpoint from which data items are removed. At any one time, only one kernel (or kernel instance) may write into a pipe, and only one kernel (or kernel instance) may read from a pipe. For example, one kernel may connect to the write endpoint while another kernel may connect to the reading endpoint.

Figure 3:
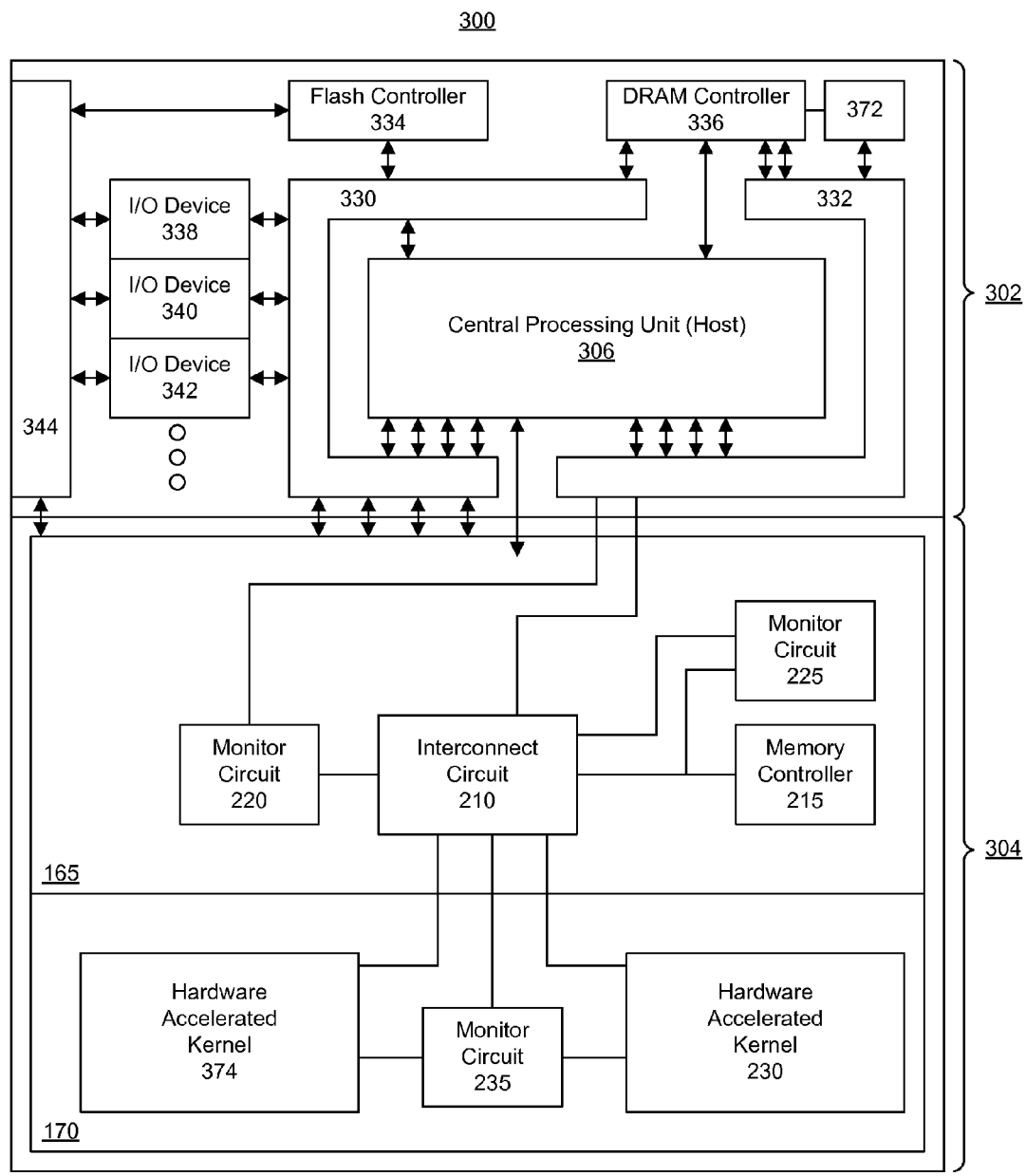
FIG. 3 is a block diagram illustrating another example of a platform.

FIG. 3 is a block diagram illustrating another example of a platform 300. In the example of FIG. 3, platform 300 may be implemented as a programmable IC. More particularly, the programmable IC may be an example of a system-on-chip (SOC).

An SOC is an IC that includes a plurality of different subsystems on a single chip substrate. The subsystems of the SOC are integrated to work cooperatively with one another. One example of an SOC is a chip level implementation of a computer. For example, the SOC may include a processor that executes program code. The processor operates cooperatively with the other on-chip subsystems. The other on-chip subsystems may be digital circuits, analog circuits, mixed-signal circuits, or the like. In the example of FIG. 3, the SOC includes a processor and subsystems that may be hardwired and/or implemented in programmable circuitry.

As pictured, platform 300 includes a processor system 302 and programmable circuitry 304. Processor system 302 is hardwired. As such, the various elements pictured within processor system 302 exist within platform 300 without first having to load configuration data, i.e., a configuration bitstream. By comparison, programmable circuitry 304 is not hardwired. Programmable circuitry 304, as described herein, includes one or more programmable circuit blocks or tiles that are configured to form the particular circuit structures shown and operations described only after configuration data is loaded.

Processor system 302 may include a central processing unit (CPU) 306. In the example shown, CPU 306 is the host. CPU 306 is communicatively linked with other circuit elements within processor system 302 through on-chip interconnects 330 and 332. Interconnects 330 and 332 may be implemented as bus interfaces. One example of an interconnect structure that may be used to implement interconnects 330 and/or 332 is the Advanced Microcontroller Bus Architecture (AMBA®) Interconnect available from ARM Inc. Interconnects 330 and 332 provide on-chip connection and management of functional circuit blocks in an SOC.

Interconnect 330 couples CPU 306 to a flash controller 334, a DRAM controller 336, and one or more I/O devices 338, 340, and 342. Interconnect 330 further provides communication links into programmable circuitry 304 that couple various circuits and/or systems that may be implemented within programmable circuitry 304 to CPU 306. Interconnect 332 couples CPU 306 to DRAM controller 336. Interconnect 332 may also couple various circuits and/or systems that may be implemented within programmable circuitry 304 to CPU 306. As shown, DRAM controller 336 may also be directly coupled to CPU 306.

I/O devices 338, 340, and 342 are coupled to an I/O multiplexer 344. I/O multiplexer 344 receives signals from I/O devices 338, 340, and 342, and from flash controller 334, and selectively routes the signals to I/O pins of the IC and/or into programmable circuitry 304. Similarly, I/O multiplexer 344 may selectively route signals from I/O pins of the IC into programmable circuitry 304 and/or into one or more of I/O devices 338, 340, and/or 342, and/or flash controller 334.

In one arrangement, processor system 302 may include one or more hardwired monitor circuits such as monitor circuit 372. Monitor circuit 372 is coupled to DRAM controller 336 and to interconnect 332. Monitor circuit 372 may be configured to monitor memory read and/or memory write transactions as performed by DRAM controller 336, whether initiated by CPU 306, kernel 230, and/or kernel 374.

In the example of FIG. 3, programmable circuitry 304 may implement regions 165 and 170. In general, region 165 and the various circuit blocks implemented therein may operate substantially as described with reference to FIG. 2. As pictured, region 165 may include interconnect circuit 210 and monitor circuit 220. Interconnect circuit 210 is coupled to interconnect 332, which provides a connection to CPU 306. As noted, CPU 306 functions as the host. Region 165 may optionally include memory controller 215 and monitor circuit 225. In some cases, for example, use of a customized memory controller may be desired over the hardwired DRAM controller 336 within processor system 302. Still, memory controller 215 and monitor circuit 225 may be omitted from region 165 in the example of FIG. 3.

Region 170 may include kernel 230 and monitor circuit 235. For purposes of illustration, an additional kernel 374 is shown. In this example, monitor circuit 235 may also monitor operation of kernel 374 and/or transactions performed between kernel 374 and kernel 230. Kernels 230 and 374 illustrate an example of a pipe as previously described.

Figure 4:
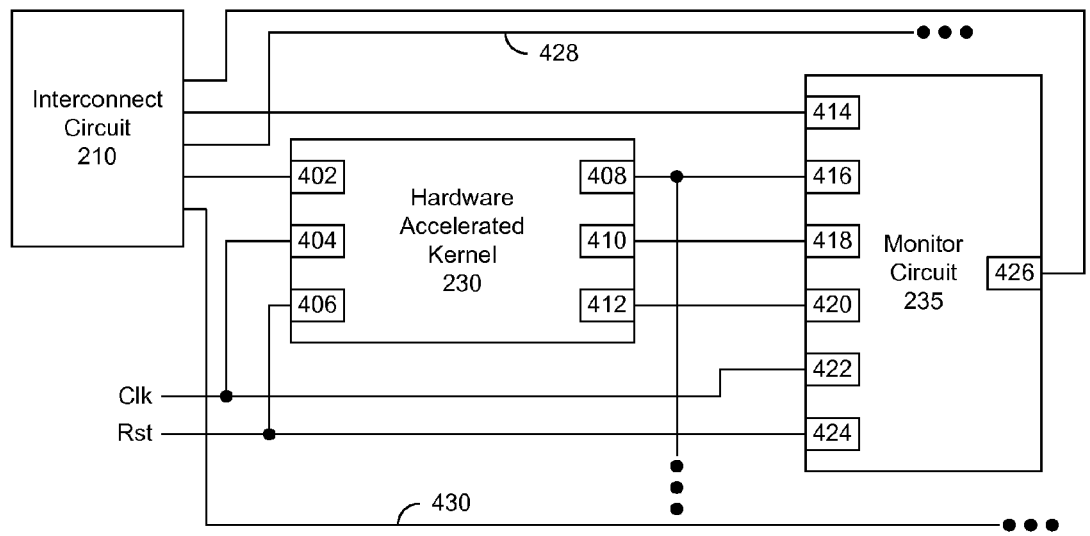
FIG. 4 is a block diagram illustrating an exemplary implementation of a hardware accelerated kernel and monitor circuit within a programmable IC.

FIG. 4 is a block diagram illustrating an exemplary implementation of kernel 230, monitor circuit 235, and interconnect circuit 210 using programmable circuitry. Interconnect circuit 210 may be coupled to a bus interface such as bus interface circuit 205 or interconnect 332 in order to communicate with a host.

As pictured, kernel 230 may include a plurality of ports 402, 404, 406, 408, 410, and 412. Port 402 may be a control port (e.g., s_axi_control) through which kernel 230 communicates with the host. Port 404 may be a clock port coupled to a clock (Clk) signal. Port 406 may be a reset port coupled to a reset (Rst) signal. Port 408 may be a data port (e.g., m_axi_gmem) that may be coupled to one or more other hardware accelerated kernels. As pictured, for example, the signal from port 408 may extend down and couple to one or more other circuits in region 170. Further, port 408 may be coupled to a monitor port 416 of monitor circuit 235. Port 410 may be an event start port that outputs an indicator signal responsive to kernel 230 starting an operation. Port 412 may be an event end port that outputs an indicator signal responsive to kernel 230 ending the operation.

Monitor circuit 235 includes a plurality of ports 414, 416, 418, 420, 422, 424, and 426. Port 414 may be a control port (S_AXI) that is coupled to interconnect circuit 210. The host may control operation of monitor circuit 235 through port 414. Port 416 may be a monitor port (SLOT_0_AXI) that detects events and/or data output from port 408 of kernel 230. Port 418 may be coupled to the event start port 410 of kernel 230 to detect indicator signals output by kernel 230 that an operation has started. Port 420 may be coupled to the event end port 412 of kernel 230 to detect indicator signals output by kernel 230 that the operation has ended. Port 422 may be a clock port coupled to the clock signal. Port 424 may be a reset port coupled to the reset signal. Port 426 is coupled to interconnect circuit block 210. In one arrangement, the host may read data collected and stored by monitor circuit 235 through port 426.

Interconnect circuit 210 may include one or more additional ports that couple to signals such as signals 428 and/or 430, which may be provided to other circuits in region 170 whether other hardware accelerated kernels and/or other monitor circuits.

Figure 5:
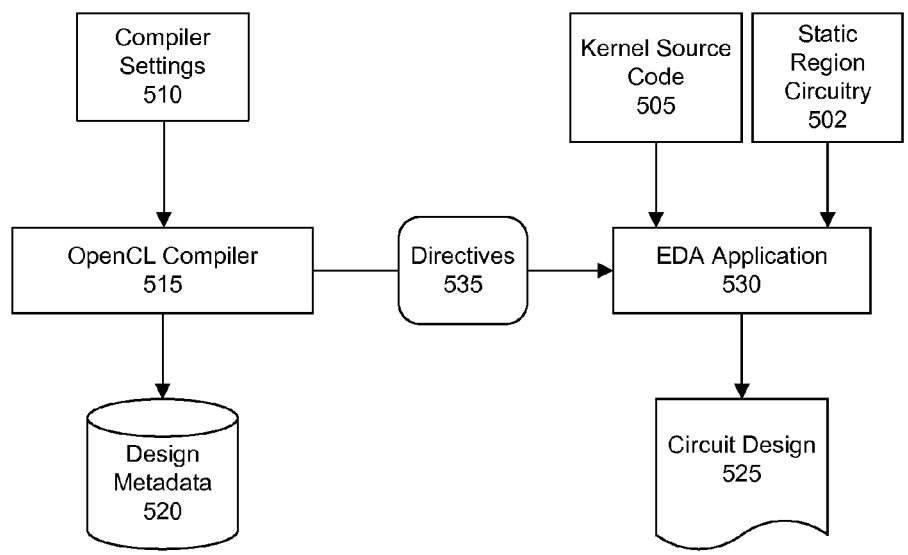
FIG. 5 is a block flow diagram illustrating an exemplary method of creating a circuit design specifying a kernel and a monitor circuit.

FIG. 5 is a block flow diagram illustrating an exemplary method of creating a circuit design specifying a kernel and a monitor circuit. FIG. 5 illustrates an example of compile time operation of a data processing system that includes an OpenCL compiler 515 and an electronic design automation (EDA) application 530.

Kernel source code 505 may be specified in an HLL such as OpenCL C and/or C++. OpenCL compiler 515 may receive compiler settings 510. Compiler settings 510, which may be set by a user, may include directives, pragmas, and the specifying that monitoring of the hardware accelerated kernel to be generated from kernel source code 505 is desired. In general, OpenCL compiler 515, in response to compiler settings 510, may execute cooperatively with EDA application 530 to generate design metadata 520 and generate a circuit design 525. OpenCL compiler 515 may generate one or more directives 535 that may be provided to EDA application 530. EDA application 530 may execute the directives to generate circuit design 525.

In one arrangement, responsive to the directives, EDA application 530 may generate a block level description of region 170. The description may implement region 170 as described with reference to FIG. 4. For example, EDA application 530 may translate kernel source code 505 into a register transfer level (RTL) or hardware description language (HDL) description of the kernel (the "RTL" kernel). The RTL kernel, for example, may correspond to kernel 230 of FIG. 4. EDA application 530 may automatically include a monitor core within the description corresponding to monitor circuit 235 of FIG. 4. Further, EDA application 530 may specify connections among the elements of region 170 (e.g., the RTL kernel and the monitor core) and establish connections between region 165 and region 170 (e.g., between the RTL kernel, monitor core and interconnect circuit 210). For example, EDA application 530 may specify the port connections described with reference to FIG. 4 within the block level description of region 170 that is generated. EDA application 530 may also synthesize, place, and route the block level description resulting in circuit design 525. Circuit design 525 may be specified as a configuration bitstream.

In one arrangement, circuit design 525 may be implemented within a dynamically reconfigurable region of a programmable IC. In that case, circuit design 525 may be designated or implemented as a partial configuration bitstream. The partial configuration bitstream specifies only the implementation of the kernel(s) and monitor circuit(s) coupled thereto as described with reference to region 170. As an example, the partial configuration bitstream may specify kernel 230 and monitor circuit 235 of FIG. 1 or kernels 230 and 374 and monitor circuit 235 of FIG. 3.

In another arrangement, EDA application 530 may generate a full configuration bitstream. In that case, static region circuitry 502 may be provided to EDA application 530. Static region circuitry 502 may be a placed and routed circuit design for region 165. In one aspect, static region circuitry 502 may be specified as a partial configuration bitstream. In another aspect, static region circuitry 502 may be placed and routed and specified in an internal format prior to being translated into a partial configuration bitstream. EDA application 530 may synthesize, place, and route the RTL version of kernel source code 505 and, using static region circuitry 502, generate circuit design 525 which may specify both regions 165 and 170.

OpenCL compiler 515 may also generate design metadata 520. Design metadata 520 may specify information such as a list of hardware accelerated kernels implemented within region 170, monitor circuits implemented within region 170, addresses of kernels and/or monitor circuits within region 170, indications of which monitor circuits are connected to which kernels in region 170, and the like. In one aspect, one or more portions or all of design metadata 520 may be generated and/or provided to OpenCL compiler 515 by EDA application 530. Design metadata 520 may be used by a host to communicate with the hardware accelerated kernel(s), the monitor circuit(s), and the like. For example, design metadata 520 may be provided to a host at run-time. The host may read design metadata 520 and determine how to communicate with circuit blocks in region 170.

Example 1 below illustrates various directives that instruct EDA application 530 how to create and configure region 170. In one arrangement, OpenCL compiler 515 may generate the directives illustrated below. EDA application 530 may then perform high level synthesis by executing the directives of Example 1.

Example 1 inst_kernel mmult_1 mmult [list] OCL_REGION_0
connect_kernel OCL_REGION_0/mmult_1 M_AXI_G-MEM
add_profiling OCL_REGION_0/mmult_1.m_axi_gmem
generate_profiling_cores
generate_target {synthesis simulation implementation} [get_files opencldesign.bd]

Example 1 illustrates that a kernel referred to as "mmult" for "matrix multiply" is instantiated within an OCL region (e.g., region 170) of the programmable IC. The kernel is then connected to the OCL region. Since the OCL region connects to the static region (region 165) using a known or predetermined interconnect structure such as interconnect circuit 210, EDA application 530 connects the kernel thereto. The known interconnect structure may include both master and slave interfaces. As such, the interface circuitry used by the OCL region remains the same regardless of the number of kernels implemented in the OCL region. The "add_profiling" directive instructs EDA application 530 to add a monitor core for the kernel. The monitor circuit is connected to the kernel and to the known interconnect structure as described with reference to FIG. 4. The "generate_target" directive causes EDA application 530 to perform synthesis, placement, and routing of the circuit design.

Figure 6:
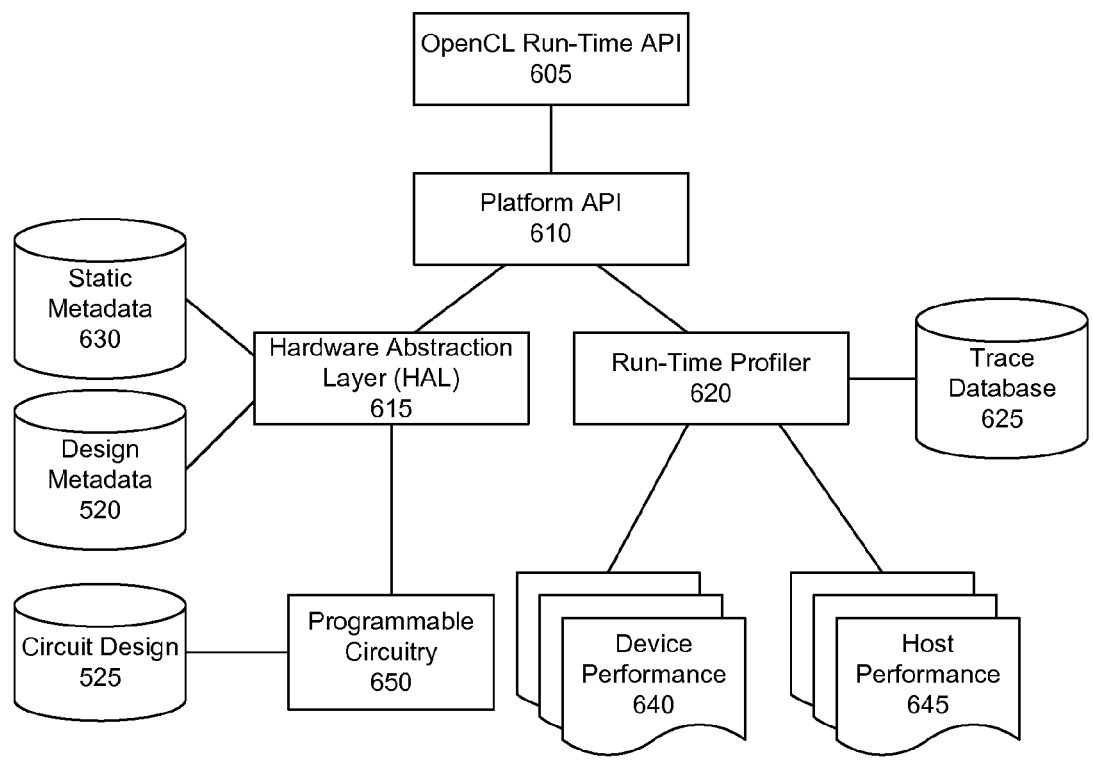
FIG. 6 is a block diagram illustrating an exemplary call graph for an OpenCL run-time supporting device profiling.

FIG. 6 is a block diagram illustrating an exemplary call graph for an OpenCL run-time supporting device profiling. An OpenCL run-time is a library of functions and/or data that, at compile time, may be incorporated into the program code of the OpenCL application executed by a host as part of a platform. The OpenCL run-time provides functions for communicating with hardware accelerated kernels. The OpenCL run-time of FIG. 6 also supports device profiling as performed by the hardware monitors illustrated in FIGS. 2-4.

As pictured, the OpenCL run-time includes an OpenCL run-time application programming interface (API) 605. OpenCL run-time API 605 facilitates communication between a host such as host 105 or CPU 306 and the hardware accelerated kernel(s) implemented within region 170 of a programmable IC. Program code of the OpenCL application executing in the host may invoke or access OpenCL run-time API 605. A platform API 610 is also included. Platform API 610 is able to communicate with both hardware abstraction layer (HAL) 615 and run-time profiler 620.

In one aspect, HAL 615 is configured to communicate directly with circuitry implemented within the regions 165 and 170 of the programmable IC used to hardware accelerate kernels. HAL 615 is configured to communicate with regions 165 and 170 to conduct monitoring using the monitor circuits. For example, HAL 615 may initiate starting and stopping of one or more or all of the monitor circuits, reading of operational (e.g., profiling) data collected and stored by the monitor circuit(s), and the like. In this regard, HAL 615 may determine the amount of time the various kernels are active. HAL 615 may also monitor, via the monitor circuits, kernel-to-memory and kernel-to-kernel transactions as previously described.

HAL 615 may include static metadata 630. In one arrangement, static metadata 630 may be built into the OpenCL run-time library through compilation. Static metadata 630 may specify the various circuit blocks included in region 165 and the address for each circuit block. For example, static metadata 630 may list bus interface circuit 205, memory controller 215, monitor circuit 220, monitor circuit 225, and an address for each. Static metadata 630 may also specify which circuit blocks are coupled to the various monitor circuits listed. For example, static metadata 630 may specify that monitor circuit 220 is coupled to bus interface circuit 205 and that monitor circuit 225 is coupled to memory controller 215. Further, static metadata 630 may specify how monitor circuits 220 and 225 are coupled to other circuit blocks thereby indicating what signals and/or operations may be monitored by monitor circuit 220 and/or monitor circuit 225. Since region 165 may be predetermined, static metadata 630 may be compiled within, or as part of, HAL 615.

In the case of an architecture as illustrated in FIG. 3, the static metadata may provide similar information. The static metadata may list interconnect circuit 210, memory controller 215 (if included), DRAM controller 336, monitor circuit 220, monitor circuit 225 (if included), and monitor circuit 372.

The content of region 170 is unknown until after compile time. As such, design metadata 520, as described in FIG. 5, is not available until after compile time. Once circuitry for region 170 is implemented, design metadata 520 may specify a list of kernels that are hardware accelerated within region 170, a list of available monitor circuits within region 170, which monitor circuits are coupled to which kernels, and how the monitor circuits are connected to the kernels. In one aspect, design metadata 520 may be generated and stored in memory within the platform so that the host and, in particular HAL 615, may read design metadata 520 to determine which kernels are implemented in region 170, the particular monitor circuits implemented in region 170, and the like. As shown, circuit design 525 may be implemented within programmable circuitry 650 of a programmable IC.

Run-time profiler 620 may store operation data received from the monitor circuits within trace database 625. The operation data may include trace information with timestamps, counter values of the monitor circuits, and the like. The counter values may indicate a number of bytes transferred, a number of transactions detected, or the like. Run-time profiler 620 may read (or sample) the operation data at some predetermined interval. In one aspect, run-time profiler 620 may allow operation data to accumulate and read the operation data when the monitor circuit(s) start running out of memory. In another aspect, run-time profiler 620 may read memory of the monitor circuits while running.

Run-time profiler 620 may store the operation data within trace database 625. Run-time profiler 620 may parse trace database 625 and generate and/or display device performance data 640 and/or host performance data 645. Run-time profiler 620, for example, may generate a timeline trace report and/or a summary report that provides device performance data 640 and/or host performance data 645 to a user. In still another arrangement, run-time profiler 620 may present the information through an OpenCL GUI that may be provided by run-time profiler 620 as part of the platform.

Figure 7:
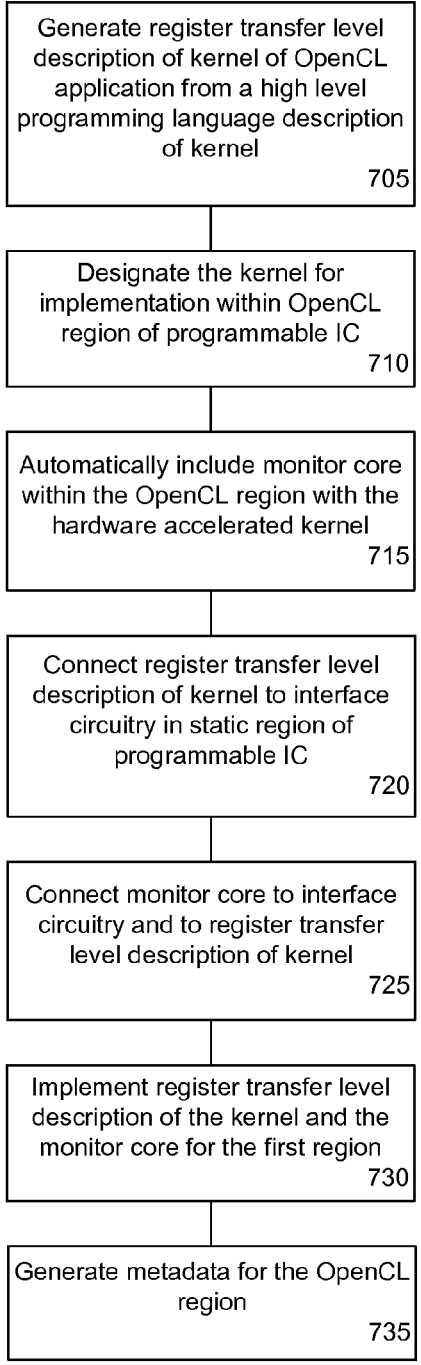
FIG. 7 is a flow chart illustrating an exemplary method of device profiling for an OpenCL application.

FIG. 7 is a flow chart illustrating an exemplary method 700 of device profiling for an OpenCL application. Method 700 illustrates exemplary operations that may be performed by a data processing system executing an OpenCL compiler and/or an EDA application. Method 700 may begin in a state where an OpenCL application is being processed for hardware acceleration using a selected programmable IC. The programmable IC may include a static region (i.e., region 165) that includes pre-defined interface circuitry for an OpenCL region (i.e., region 170) in which hardware accelerated kernels may be implemented. Further, a user may have requested monitoring of hardware accelerated kernel operations. As discussed, monitor circuits within the static region may be included as part of the pre-defined interface circuitry and need not be added. Method 700 illustrates one technique for including monitor circuits within the OpenCL region.

In block 705, the system may generate an RTL description of a kernel of an OpenCL application from an HLL description of the kernel. For example, an HLL description of a kernel may be provided to the system as an input. The system may translate the HLL description into an RTL description of the kernel. In block 710, the system may designate the kernel for implementation within an OpenCL region of a programmable IC. As discussed with reference to FIG. 5, the system may generate a description of the OpenCL region into which the RTL description of the kernel may be included.

In block 715, the system may automatically include one or more monitor cores within the OpenCL region, e.g., within the description of the OpenCL region. As defined within this disclosure, a "core" means a reusable unit of logic, a cell, a portion of chip layout design, or portion of a circuit design. For example, a core may be specified in RTL or in HDL, as a netlist, as a configuration bitstream or portion thereof, or the like. In some cases, a core may be specified in a high level programming language.

In block 720, the system may connect the RTL description of the kernel to interface circuitry in the static region. For example, the system may specify port and/or signal connections to connect the RTL description of the kernel with the interface circuitry, e.g., interconnect circuit 210, of static region.

In block 725, the system may connect the monitor core to the interface circuitry and to the RTL description of the kernel. The system, for example, may specify port and/or signal connections to connect the monitor core to the RTL description of the kernel and to interconnect circuit 210.

In block 730, the system may implement the RTL description of the kernel and the monitor core for the OpenCL region. For example, the system may perform synthesis, placement, and routing for the RTL description of the kernel and the monitor core. The system may generate a configuration bitstream. As discussed, in one aspect, the system may generate a partial configuration bitstream specifying only circuitry for the OpenCL region.

In the case of a partial configuration bitstream, the partial configuration bitstream may be loaded into a programmable IC while the static region, which may be specified by another, different partial configuration bitstream, is already loaded into the programmable IC and is operational. Using a partial configuration bitstream for the OpenCL region allows a system designer to create one or more other partial configuration bitstreams specifying different hardware accelerated kernels and/or hardware accelerated kernel configurations that may be loaded into the programmable IC as needed while the static region remains operational and in communication with the host of the platform.

In another aspect, the system may generate a configuration bitstream specifying both the static region and the OpenCL region. In that case, a single, larger configuration bitstream may be loaded into the programmable IC to implement both the static and OpenCL regions. Implementing the OpenCL region as a partial configuration bitstream requires significantly less time than generating a configuration bitstream specifying both the static and OpenCL regions.

In block 735, the system may generate the design metadata for the OpenCL region. In performing implementation as described in block 730, the system determines the connectivity and addresses of the various circuit blocks implemented within the OpenCL region. The system may generate and store the design metadata that describes addressing, included kernels, monitor circuits, which monitor circuits are monitoring which kernels, and the like.

Figure 8:
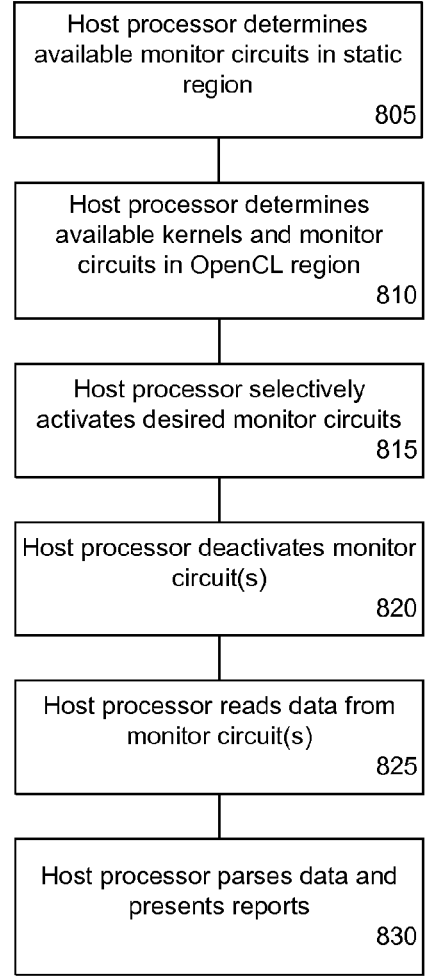
FIG. 8 is a flow chart illustrating another exemplary method of device profiling for an OpenCL application.

FIG. 8 is a flow chart illustrating an exemplary method 800 of device profiling for an OpenCL application. Method 800 illustrates exemplary operations that may be performed by a platform such as platform 100 of FIG. 1 or platform 300 of FIG. 3 in executing an OpenCL application with device profiling implemented therein. Accordingly, method 800 may begin in a state where an OpenCL application is being executed by the platform that includes a programmable IC with hardware accelerated kernel(s) and monitor circuits as described.

In block 805, the host may determine available monitor circuits in the static region. As noted, the available monitor circuits in the static region may be determined by reading static metadata 630. In block 810, the host may determine available monitor circuits in the OpenCL region. For example, the host may read design metadata 520 generated for the OpenCL region. From design metadata 520, the host may determine which kernels are implemented in the OpenCL region, which monitor circuits are implemented in the OpenCL region, and connectivity between hardware accelerated kernels, addresses of hardware accelerated kernels and monitor circuits, and the like.

In block 815, the host may selectively activate one or more or all monitor circuits, including one or more monitor circuits in the static region and/or the OpenCL region. The host may send control signals to the monitor circuits instructing each to begin collecting operation data. In one aspect, the host may initiate monitoring responsive to a user command provided through a GUI during execution of the OpenCL application. Similarly, the user may request termination of monitoring through the GUI. In another aspect, the user may specify one or more locations in the OpenCL application that the host processor is to start and/or stop monitoring.

Accordingly, each of the activated monitor circuits may collect timestamped start and/or timestamped stop events for data transfers, aggregate counts of bytes, data transfer counts, latency, minimum and/or maximum latency, stall cycle measurements, busy and/or idle time, and the like for the particular circuit blocks that are being monitored. The monitor circuit for the memory controller may collect the aforementioned operation data for memory read and write operations whether initiated by the host or a kernel. The monitor circuit for the host bus interface may collect the aforementioned operation data for communications entering and/or leaving the host bus interface. The monitor circuit(s) for the kernels may collect the aforementioned operation data kernels, whether occurring between kernel and the static region (region 165), between kernels (e.g., pipes), between kernel(s) and local memories in region 170, or the like.

In block 820, the host may deactivate the monitor circuits. The monitor circuits may discontinue collecting operation data. In block 825, the host may read the collected operation data from the monitor circuits. While method 800 describes an example where the host reads data after the monitor circuits stop collecting operation data, in another aspect, the host may read data from the monitor circuits while the monitor circuits are actively collecting operation data.

In block 830, the host may parse the data and present reports. As discussed, the operation data may be collected and stored in a trace database. The host may provide a GUI through which a user may view and evaluate the operation data. In another aspect, the collected operation data may be exported to another system for processing, viewing, and/or further analysis.

Figure 9:
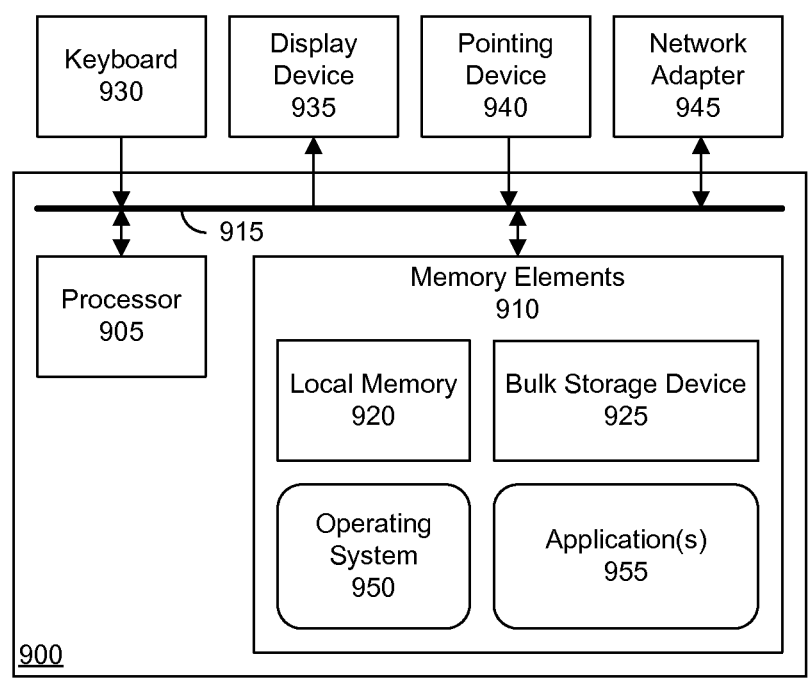
FIG. 9 is a block diagram illustrating an exemplary data processing system for use with the inventive arrangements disclosed herein.

FIG. 9 is a block diagram illustrating an exemplary data processing system (system) 900 for use with the inventive arrangements disclosed herein. System 900 may be used, for example, to execute the OpenCL compiler and/or EDA application as described. System 900 may be used to implement operations described with reference to FIGS. 4-7, for example.

As pictured, system 900 includes at least one processor, e.g., a central processing unit (CPU), 905 coupled to memory elements 910 through a system bus 915 or other suitable circuitry. System 900 stores computer readable instructions (also referred to as "program code") within memory elements 910. Memory elements 910 may be considered an example of computer readable storage media. Processor 905 executes the program code accessed from memory elements 910 via system bus 915.

Memory elements 910 may include one or more physical memory devices such as, for example, a local memory 920 and one or more bulk storage devices 925. Local memory 920 refers to RAM or other non-persistent memory device(s) generally used during actual execution of the program code. Bulk storage device 925 may be implemented as a hard disk drive (HDD), solid state drive (SSD), or other persistent data storage device. System 900 may also include one or more cache memories (not shown) that provide temporary storage of at least some program code in order to reduce the number of times program code must be retrieved from bulk storage device 925 during execution.

Input/output (I/O) devices such as a keyboard 930, a display device 935, a pointing device 940, and one or more network adapters 945 may be coupled to system 900. The I/O devices may be coupled to system 900 either directly or through intervening I/O controllers. In some cases, one or more of the I/O devices may be combined as in the case where a touchscreen is used as display device 935. In that case, display device 935 may also implement keyboard 930 and pointing device 940. Network adapter 945 may be used to couple system 900 to other systems, computer systems, remote printers, and/or remote storage devices through intervening private or public networks. Modems, cable modems, Ethernet cards, and wireless transceivers and/or radios are examples of different types of network adapter 945 that may be used with system 900. Depending upon the particular implementation of system 900, the specific type of network adapter, or network adapters as the case may be, will vary.

As pictured in FIG. 9, memory elements 910 may store an operating system 950 and one or more applications 955. Application(s) 955, for example, may include an OpenCL compiler and an EDA application. In one aspect, operating system 950 and application(s) 955, being implemented in the form of executable program code, are executed by system 900 and, in particular, by processor 905. As such, operating system 950 and application(s) 955 may be considered an integrated part of system 900. Operating system 950, application(s) 955, and any data items used, generated, and/or operated upon by system 900 are functional data structures that impart functionality when utilized by system 900.

In one aspect, system 900 may be a computer or other device that is suitable for storing and/or executing program code. System 900 may represent any of a variety of computer systems and/or devices that include a processor and memory and that are capable of performing the operations described within this disclosure. In some cases, the particular computer system and/or device may include fewer components or more components than described. System 900 may be implemented as a single system as shown or as a plurality of networked or interconnected systems each having an architecture the same as, or similar to, that of system 900.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined herein, the term "hardware description language" is a computer-language that facilitates the documentation, design, and manufacturing of a digital system, such as an integrated circuit. A hardware description language, or HDL, combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, which is a primary attribute of a digital system.

As defined herein, the term "high level programming language" means a programming language, or set of instructions, used to program a data processing system where the instructions have a strong abstraction from the details of the data processing system, e.g., machine language. For example, a high level programming language may automate or hide aspects of operation of the data processing system such as memory management. The amount of abstraction typically defines how "high level" the programming language is. Using a high level programming language frees the user from dealing with registers, memory addresses, and other low level features of the data processing system upon which the high level programming language will execute. In this regard, a high level programming language includes little or no instructions that translate directly, on a one-to-one basis, into a native opcode of a data processing system. Examples of high level programming languages include, but are not limited to, C, C++, SystemC, OpenCL C, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

The term "signal" may refer to the conveyance of a single bit, e.g., a single wire, or the conveyance of multiple parallel bits through multiple parallel wires. Further, each signal may represent bi-directional communication between two, or more, components connected by the signal.

A computer program product may include a computer readable storage medium (or media) having computer readable program instructions thereon for causing a processor to carry out aspects of the inventive arrangements described herein. Computer readable program instructions described herein may be downloaded to respective computing/processing devices from a computer readable storage medium or to an external computer or external storage device via a network, for example, the Internet, a local area network (LAN), a wide area network (WAN) and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, state-setting data, or either source code or object code written in any combination of one or more programming languages, including an object oriented programming language and/or procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A system may include a first region implemented in programmable circuitry of a programmable IC, wherein the first region includes predefined interface circuitry configured to communicate with a host processor. The system may also include a second region implemented in the programmable circuitry of the programmable IC. The second region may include a first hardware accelerated kernel of an OpenCL application. The system may include a first monitor circuit implemented within the first region or the second region. The first hardware accelerated kernel and the first monitor circuit may be coupled to the interface circuitry of the first region. The first monitor circuit may be operable responsive to control signals received from the host processor of a platform through the interface circuitry to store operation data for the first region or the first hardware accelerated kernel.

The first monitor circuit may be configured to store start and stop events of the first hardware accelerated kernel as the operation data. The first monitor circuit is configured to detect start and stop events for a plurality of different compute units of the first hardware accelerated kernel.

The first monitor circuit may be configured to monitor data transfers between the first hardware accelerated kernel and a second hardware accelerated kernel implemented within the second region.

In one aspect, the second region may be a dynamically reconfigurable region of the programmable IC.

The interface circuitry of the first region may include an interconnect circuit coupled to the first hardware accelerator and the first monitor circuit and a second monitor circuit coupled to the interconnect circuit. The second monitor circuit may be configured to monitor communications between the host processor and the first hardware accelerated kernel.

The interface circuitry may include a memory controller configured to perform operations received from the host processor and from the first hardware accelerated kernel and a third monitor circuit configured to monitor the operations provided to the memory controller.

The interface circuitry may include a bus interface circuit coupled to the interconnect circuit and communicatively linked to the host processor.

A method may include, using a processor, generating an RTL description of a kernel of an OpenCL application from an HLL description of the kernel, using the processor, designating the RTL description of the kernel for implementation within an OpenCL region of a programmable IC, and, using the processor, automatically including a monitor core coupled to the RTL description of the kernel within the OpenCL region. The monitor core may be configured to detect operations of a hardware accelerated version of the kernel. The method may include, using the processor, implementing the RTL description of the kernel and the monitor core for the OpenCL region.

The method may include generating design metadata including address data for a monitor circuit implementation within the OpenCL region of the monitor core, wherein the design metadata is usable by a host processor executing host program code of the OpenCL application.

The method may include the host processor, during runtime, reading the design metadata and communicating with the monitor circuit using the address data.

In one aspect, communicating with the monitor circuit may include activating and deactivating the monitor circuit for a hardware accelerated version of the kernel. In another aspect, communicating with the monitor circuit may include reading operation data of the hardware accelerated version of the kernel from the monitor circuit.

The method may include connecting the RTL description of the kernel to predefined interface circuitry of a static region of the programmable IC and connecting the monitor core to the predefined interface circuitry and to the RTL description of the kernel.

The method may also include generating design metadata specifying a list of kernels implemented within the OpenCL region, a list of monitor circuits implemented within the OpenCL region, an address for each kernel and monitor circuit implemented within the OpenCL region, and an indication of the particular monitor circuit corresponding to each kernel implemented in the OpenCL region.

A non-transitory computer-readable storage medium may have instructions stored thereon which, when executed by a processor, perform a method. The method may include generating an RTL description of a kernel of an OpenCL application from an HLL description of the kernel, designating the RTL description of the kernel for implementation within an OpenCL region of a programmable IC, and automatically including a monitor core coupled to the RTL description of the kernel within the OpenCL region. The monitor core may be configured to detect operations of a hardware accelerated version of the kernel. The method further may include implementing the RTL description of the kernel and the monitor core for the OpenCL region.

The method may include generating design metadata including address data for a monitor circuit implementation within the OpenCL region of the monitor core, wherein the design metadata is usable by a host processor executing host program code of the OpenCL application.

The method may include the host processor, during runtime, reading the design metadata and communicating with the monitor circuit using the address data.

The method may include connecting the RTL description of the kernel to predefined interface circuitry of a static region of the programmable IC and connecting the monitor core to the predefined interface circuitry and to the RTL description of the kernel.

The method may also include generating design metadata specifying a list of kernels implemented within the OpenCL region, a list of monitor circuits implemented within the OpenCL region, an address for each kernel and monitor circuit implemented within the OpenCL region, and an indication of the particular monitor circuit corresponding to each kernel implemented in the OpenCL region.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A system, comprising:
a first region implemented in programmable circuitry of a programmable integrated circuit, wherein the first region comprises predefined interface circuitry configured to communicate with a host processor;
a second region implemented in the programmable circuitry of the programmable integrated circuit, wherein the second region comprises a first hardware accelerated kernel of an OpenCL application; and
a first monitor circuit implemented within the first region or the second region;
wherein the first hardware accelerated kernel and the first monitor circuit are coupled to the interface circuitry of the first region and the first monitor circuit is operable responsive to control signals received from the host processor of a platform through the interface circuitry to store operation data for the first region or the first hardware accelerated kernel; and
wherein the interface circuitry of the first region comprises an interconnect circuit coupled to the first hardware accelerator and the first monitor circuit.

2. The system of claim 1, wherein the first monitor circuit is configured to store start and stop events of the first hardware accelerated kernel as the operation data.

3. The system of claim 2, wherein the first monitor circuit is configured to detect start and stop events for a plurality of different compute units of the first hardware accelerated kernel.

4. The system of claim 1, wherein the first monitor circuit is configured to monitor data transfers between the first hardware accelerated kernel and a second hardware accelerated kernel implemented within the second region.

5. The system of claim 1, wherein:
the second region is a dynamically reconfigurable region of the programmable integrated circuit; and
the first region is a static region configured to remain in communication with the host processor while the second region is dynamically reconfigured.

6. The system of claim 1, wherein the interface circuitry of the first region comprises:
a second monitor circuit coupled to the interconnect circuit and configured to monitor communications between the host processor and the first hardware accelerated kernel.

7. The system of claim 6, wherein the interface circuitry comprises:
a memory controller configured to perform operations received from the host processor and from the first hardware accelerated kernel; and
a third monitor circuit configured to monitor the operations provided to the memory controller.

8. The system of claim 7, wherein the interface circuitry comprises:
a bus interface circuit coupled to the interconnect circuit and communicatively linked to the host processor.

9. A method, comprising:
using a processor, generating a register transfer level description of a kernel of an OpenCL application from a high level programming language description of the kernel;
using the processor, designating the register transfer level description of the kernel for implementation within an OpenCL region of a programmable integrated circuit;
using the processor, automatically including a monitor core coupled to the register transfer level description of the kernel within the OpenCL region, wherein the monitor core is configured to detect operations of a hardware accelerated version of the kernel;
using the processor, implementing the register transfer level description of the kernel and the monitor core for the OpenCL region;
connecting the register transfer level description of the kernel to predefined interface circuitry of a static region of the programmable integrated circuit including an interconnect circuit; and
connecting the monitor core to the interconnect of the predefined interface circuitry and to the register transfer level description of the kernel.

10. The method of claim 9, further comprising:
generating design metadata during compilation comprising address data for a monitor circuit implementation within the OpenCL region of the monitor core, wherein the design metadata is usable by a host processor executing host program code of the OpenCL application.

11. The method of claim 10, further comprising:
the host processor, during run-time, reading the design metadata and communicating with the monitor circuit using the address data.

12. The method of claim 11, wherein communicating with the monitor circuit comprises:
activating and deactivating the monitor circuit for a hardware accelerated version of the kernel.

13. The method of claim 12, wherein communicating with the monitor circuit comprises:
reading operation data of the hardware accelerated version of the kernel from the monitor circuit.

14. The method of claim 9, further comprising:
connecting a second monitor circuit to the interconnect circuit, wherein the second monitor circuit is configured to monitor communications between the host processor and the first hardware accelerated kernel.

15. The method of claim 9, further comprising:
generating design metadata during compilation specifying a list of kernels implemented within the OpenCL region, a list of monitor circuits implemented within the OpenCL region, an address for each kernel and monitor circuit implemented within the OpenCL region, and an indication of the particular monitor circuit corresponding to each kernel implemented in the OpenCL region;
wherein the design metadata is readable by a host processor at runtime to communicate with the kernels and the monitor circuits.

16. A non-transitory computer-readable storage medium having instructions stored thereon which, when executed by a processor, perform a method comprising:
generating a register transfer level description of a kernel of an OpenCL application from a high level programming language description of the kernel;
designating the register transfer level description of the kernel for implementation within an OpenCL region of a programmable integrated circuit;
automatically including a monitor core coupled to the register transfer level description of the kernel within the OpenCL region, wherein the monitor core is configured to detect operations of a hardware accelerated version of the kernel;
implementing the register transfer level description of the kernel and the monitor core for the OpenCL region;
connecting the register transfer level description of the kernel to predefined interface circuitry of a static region of the programmable integrated circuit including an interconnect circuit; and
connecting the monitor core to the interconnect of the predefined interface circuitry and to the register transfer level description of the kernel.

17. The non-transitory computer-readable storage medium of claim 16, wherein the method further comprises:
generating design metadata during compilation comprising address data for a monitor circuit implementation within the OpenCL region of the monitor core, wherein the design metadata is usable by a host processor executing host program code of the OpenCL application.

18. The non-transitory computer-readable storage medium of claim 17, wherein the method further comprises:
the host processor, during run-time, reading the design metadata and communicating with the monitor circuit using the address data.

19. The non-transitory computer-readable storage medium of claim 16, wherein the method further comprises:
connecting a second monitor circuit to the interconnect circuit, wherein the second monitor circuit is configured to monitor communications between the host processor and the first hardware accelerated kernel.

20. The non-transitory computer-readable storage medium of claim 16, wherein the method further comprises:
generating design metadata during compilation specifying a list of kernels implemented within the OpenCL region, a list of monitor circuits implemented within the OpenCL region, an address for each kernel and monitor circuit implemented within the OpenCL region, and an indication of the particular monitor circuit corresponding to each kernel implemented in the OpenCL region;
wherein the design metadata is readable by a host processor at runtime to communicate with the kernels and the monitor circuits.

\* \* \* \* \*